United States Patent [19]

Grosslight

[11] Patent Number: 4,868,020
[45] Date of Patent: Sep. 19, 1989

[54] RUB AND SHOW GRAPHICS

[76] Inventor: Jane S. Grosslight, 700 North Ride, Tallahassee, Fla. 32303

[21] Appl. No.: 9,945

[22] Filed: Feb. 2, 1987

[51] Int. Cl.⁴ ................................................. B44C 1/22
[52] U.S. Cl. ........................................ 428/29; 427/11; 427/264; 434/346
[58] Field of Search ............... 428/29, 542.8; 434/346; 283/72, 102; 427/11, 264

[56] References Cited

U.S. PATENT DOCUMENTS

| | | | |
|---|---|---|---|
| 761,001 | 5/1904 | Lebateux | 428/29 |
| 775,747 | 11/1904 | Doberenz | 428/29 |
| 2,065,266 | 12/1936 | Connelly | 427/11 |
| 3,920,870 | 11/1975 | Ackerman et al. | 428/46 |
| 3,983,277 | 9/1976 | Ackerman et al. | 428/46 |
| 4,284,453 | 8/1981 | Endrizzi | 427/264 X |
| 4,374,691 | 2/1983 | Vanden Bergh | 428/206 X |
| 4,379,805 | 4/1983 | Downing et al. | 428/206 X |
| 4,505,974 | 3/1985 | Hosler | 428/329 |
| 4,508,513 | 4/1985 | Donovan | 434/346 |
| 4,591,190 | 5/1986 | Clark | 283/102 |
| 4,597,591 | 7/1986 | Gendron et al. | 283/102 X |
| 4,677,553 | 6/1987 | Roberts et al. | 283/72 X |
| 4,687,203 | 8/1987 | Spector | 434/346 X |
| 4,693,496 | 9/1987 | Leonetti et al. | 283/102 |
| 4,702,497 | 10/1987 | Newbery | 434/346 X |
| 4,713,305 | 3/1892 | Tschofen | 428/29 |

OTHER PUBLICATIONS

Page 616, the title page and verso of the title page of Webster's Seventh New Collegiate Dictionary–G. C. Merriam Co., publishers, Springfield, Mass., U.S.A.

*Primary Examiner*—Henry F. Epstein
*Attorney, Agent, or Firm*—Hurt, Richardson, Garner, Todd & Cadenhead

[57] ABSTRACT

This invention pertains to the fields of graphic arts and graphic communication. The principal use of this invention is to communicate visually with a new graphic method--a method of putting a translucent overlay on one color of pastels uniformly on a piece of paper and then removing it by erasure in order to create a desired image. The paper can be imprinted before the overlay is applied in order to give a foundation for the erasure. One prior method of graphic communication has been to put a color or several colors on a paper nonuniformly to create a desired image. Likewise, another prior method has been computer-generated images on cathode ray tubes. Both of these prior methods require training and skill. Neither are easily accomplished. This new method requires no artistic or computer skill and gives excellent results. Further, this new graphic method can be renewed by rubbing the translucent overlay back to a uniform color and an additional image created by erasing again. This invention can be used by commerce and by education to make communication more explicit. For example, in eduction, school children could indicate by erasure the states that were Confederate on a paper with this treatment and imprinted with a line drawing of the United States. Rub and Show Graphics have many applications; it is a form of highlighting by removal, not highlighting by adding like prior methods, and it is renewable.

6 Claims, No Drawings

RUB AND SHOW GRAPHICS

SUMMARY OF INVENTION

This invention pertains to the field of graphic arts and graphic communication. The principal use of this invention is to be able to communicate graphically and to be able to change it easily. The invention is a treatment consisting of a translucent overlay of one color of pastels applied uniformly to a piece of paper which can be erased by the user leaving the original color of the paper showing or highlighting an image graphically. The overlay can be rubbed back to uniform if the user does not like the first image and it can be erased again to show a different image. This renewal process can be done several times, depending upon the length of time stored and the temperature and humidity conditions of storage.

This invention solves the disadvantages of previous methods by being quick and easy to use, by not demanding training or skill, and by not entailing complex equipment. It will permit people without skill to express themselves graphically. It could achieve commercial success.

DESCRIPTION

Rub and Show Graphics are made by applying uniformly a translucent overlay to a piece of good quality paper (usually 50 pound offset paper or better) in a visible color of pastel and evenly rubbing it with a cloth or buffing pad by hand or by machine in order to infuse it onto the surface of the paper. The pastel substance typically is a medium made of dry pigments and a binder, such as gum arabic. The user of the graphics can erase the overlay and create an image by removing the overlay and by revealing the underlying color of the paper. Further, if the user is not pleased with the resulting image, the user can rub the overlay back to uniform with a soft cloth or paper tissue and can erase it again to create a different image. The user can successfully rub back the overlay to become uniform again one to three times more, depending upon the length of time the treated paper has been stored and the temperature and humidity of the storage areas.

The paper can be imprinted by photocopying or by printing with words, numbers or a drawing before being treated with the overlay. The imprint could give a frame of reference or a foundation for the erasures. Any printed matter applied to the paper is not covered in this patent application and is a copyright issue.

PRIOR METHODS

It is very difficult to communicate information satisfactorily using only words. Pictures communicate information better. The Patent and Trademark Office is aware of the benefits of communicating with pictures and often request drawings of the subject matter for patent applications. This invention makes pictures easy to produce. Many professionals in the field of lighting design have experimented with graphics to be able to show what lighting would look like in a space. Up to this point, their efforts have resulted in laborious graphics which are not easily utilized because of skill, time, and/or money investments required to produce such graphics. I discovered the Rub and Show Graphics during my searches for an easy-to-produce and an easy-to-change graphic suitable for my minimal artistic skill level. This invention certainly solves a graphic problem in my field of lighting design. Likewise, in the fields of graphic arts and graphic communication it has not been anticipated by the other uses to which people used pastels prior to my invention.

Prior methods required training or skill. Training or skill is required to create pictures on paper. Pictures made of pastels require artistic skill. The pastels are applied in single or multiple layers to create an image. This invention applies a single color and the user removes areas of the color to create a desired image. This method is not substantially taught in the field of graphics; therefore, it is not obvious. This invention does not require artistic skill and will permit many more people to create graphic images.

Creating computer-generated images on a cathode ray tube requires skill and training and demands electronic machinery and software to be accomplished. This invention does not depend upon electronic machinery and software. It utilizes a readily available and inexpensive implement, an eraser.

The prior method of drawing by applying areas of color to create an image on paper can not be easily changed. On the other hand, the prior method of computer-generated graphics can be easily changed, but only if the user knows how the machinery is operable. With this invention, the image can be changed easily and changed several times. The ability to change produces a new and unexpected result. The ability to change is particularly impressive in a sales situation.

Contrary to prior methods which added a color to highlight, this invention creates highlighting by removal and provides an unexpected surprise. People who have used this invention were surprised at the end product possible when presented with the treated paper. It was not what they anticipated.

This invention produces a new function and the interaction of the parts is necessary for the end result. It is more than an aggregation. This invention is capable of performing a function and is able to produce good and satisfactory results. The function is to allow people untrained in graphics, by hand or by computer, to produce something graphically with no more skill than being able to erase.

This invention could be used in education or in commerce. In education, it could be used for tests or for homework. For example, school children with or without skill in art could indicate by erasure the states of the Confederacy on a paper with this treatment and printed with a map of the United States. Further, they could change it, if they did not like their first answer.

In commerce, this invention could be used for advertising and could call the reader's attention to an ad. For example, advertising firms could use the treatment for a printed ad and involve the reader actively to erase the overlay and reveal some information about the product. Prior methods of overlay in advertising have been opaque and have had to be scraped off with a metal edge.

In addition, this invention could be used for sales demonstrations. For example, lighting showroom staff could demonstrate for a customer what the lighting would look like in a living room using an eraser on a sheet of paper treated with this method and imprinted with a drawing of a standard living room. Also, the showroom staff could easily change the lighting scheme image, if the customer did not like the first one.

Furthermore, this invention could be used by management for a board meeting to show growth and expansion right before the board members' eyes. This invention has many educational and many commercial applications.

The Rub and Show Graphics are a new utility to solve an age-old problem of making communication more explicit. It is inventive and distinctive. It is a novel solution. It has not been anticipated and has practical uses. It has several advantages over prior methods. One advantage is that it can permit more people to express themselves graphically, not just a few with artistic or computer skill. A second advantage is that the graphic product can be accomplished quickly, not laboriously like most graphics. A third advantage is that it gives the user the option to restore and recreate a new image after the first attempt.

What is claimed is:

1. A graphic communication device comprising a sheet of paper having a front and back surface with a uniformly applied layer of dry pastel substance infused onto said front surface and being selectively removable therefrom, said pastel being translucent and of a uniform color different from that of said paper such that, when removed, a contrast is presented between said paper and said pastel layer, said pastel also being applied in a thickness sufficient to permit re-covering of said front surface by spreading said dry pastel over the area from which it was removed.

2. A graphic communication device as defined in claim 1 in which said paper includes a graphic design permanently imprinted on said paper prior to application of said pastel layer.

3. A graphic communication device as defined in claim 2 in which said pastel substance is of a darker hue than that of said paper.

4. A method of graphic communication of comprising the steps of:
   (a) applying a uniform layer of a dry pastel substance to one surface of a sheet of paper;
   (b) selectively removing areas of said pastel for creating a contrast between the paper and pastel and highlighting areas of said paper;
   (c) rubbing the pastel remaining on the paper over the area of the paper from which it was removed with a cloth or the like for re-covering the paper with the pastel remaining on the paper and eliminating the previously created highlighted area; and
   (d) repeating steps (b) and (c) for selectively highlighting areas of said paper.

5. A method of graphic communications as defined in claim 4 including the additional step of imprinting a graphic design on said paper prior to applying said pastel in said step (a).

6. A method of graphic communication as defined in claim 4 in which said removal of said pastel in said step (b) is accomplished by rubbing an eraser over the area to be highlighted.

* * * * *